(12) United States Patent
Lyszus et al.

(10) Patent No.: US 10,157,709 B2
(45) Date of Patent: Dec. 18, 2018

(54) ACTUATING ELEMENT AND ELECTRONIC DOMESTIC APPLIANCE HAVING AT LEAST ONE ACTUATING ELEMENT

(71) Applicant: DIEHL AKO STIFTUNG & CO. KG, Wangen (DE)

(72) Inventors: Joachim Lyszus, Baindt (DE); Bruno Fuhge, Achberg (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 67 days.

(21) Appl. No.: 14/943,072

(22) Filed: Nov. 17, 2015

(65) Prior Publication Data

US 2016/0071652 A1    Mar. 10, 2016

Related U.S. Application Data

(63) Continuation of application No. PCT/EP2014/001258, filed on May 10, 2014.

(30) Foreign Application Priority Data

May 17, 2013    (DE) ........................ 10 2013 008 567

(51) Int. Cl.
*H01G 5/01*    (2006.01)
*H03K 17/96*    (2006.01)
(Continued)

(52) U.S. Cl.
CPC ................ *H01G 5/01* (2013.01); *H01G 5/38* (2013.01); *H03K 17/962* (2013.01);
(Continued)

(58) Field of Classification Search
CPC .. H01G 5/16; H01G 5/01; H01G 5/38; H03K 17/96; H03K 17/962
See application file for complete search history.

(56) References Cited

U.S. PATENT DOCUMENTS 7,667,947 B2    2/2010    Schilling et al.
7,674,993 B2 *  3/2010    Jeitner ................... B60K 37/06
                                                  200/600
(Continued)

FOREIGN PATENT DOCUMENTS

CN    102739227 A    10/2012
DE    102004013947 B3    12/2005
(Continued)

*Primary Examiner* — Nguyen Ha
(74) *Attorney, Agent, or Firm* — Laurence A. Greenberg; Werner H. Stemer; Ralph E. Locher

(57) ABSTRACT

An actuating element for an electronic domestic appliance has an electrically non-conductive carrier which defines at least one preferably substantially cylindrical detection portion. A plurality of electrically conductive measuring electrodes is spaced apart from one another along the detection portion of the carrier. A preferably substantially annular operating element is disposed at a first predefined distance from the measuring electrodes and is movable relative thereto. The operating element additionally has at least one sensor portion which is at least partially electrically conductive and is disposed at a second predefined distance from the measuring electrodes. The second predefined distance is different from the first predefined distance, so that a movement of the sensor portion and therefore of the operating element relative to the configuration of measuring electrodes can be detected.

12 Claims, 2 Drawing Sheets

(51) Int. Cl.
*H03K 17/975* (2006.01)
*H03K 17/98* (2006.01)
*H01G 5/38* (2006.01)

(52) U.S. Cl.
CPC ....... *H03K 17/9622* (2013.01); *H03K 17/975* (2013.01); *H03K 17/98* (2013.01); *H03K 2217/94073* (2013.01); *H03K 2217/96054* (2013.01)

(56) References Cited

U.S. PATENT DOCUMENTS

| | | | |
|---|---|---|---|
| 8,264,242 B2 | 9/2012 | Toyota et al. | |
| 8,730,199 B2 * | 5/2014 | Sleeman | G01L 1/146 |
| | | | 345/173 |
| 2006/0012944 A1 | 1/2006 | Mamigonians | |
| 2006/0164403 A1 * | 7/2006 | Volckers | G06F 3/0236 |
| | | | 345/184 |
| 2009/0009491 A1 * | 1/2009 | Grivna | G06F 3/033 |
| | | | 345/184 |
| 2010/0059349 A1 * | 3/2010 | Wuestenbecker | H03K 17/962 |
| | | | 200/314 |
| 2010/0231238 A1 | 9/2010 | Toyota et al. | |
| 2010/0253653 A1 | 10/2010 | Stambaugh et al. | |
| 2012/0032915 A1 * | 2/2012 | Wittorf | H03K 17/962 |
| | | | 345/174 |
| 2012/0261243 A1 | 10/2012 | Yokoyama et al. | |
| 2013/0093500 A1 | 4/2013 | Bruwer | |
| 2013/0154627 A1 | 6/2013 | Pfenning | |
| 2013/0193314 A1 * | 8/2013 | Schweninger | B60K 37/02 |
| | | | 250/214 SW |

FOREIGN PATENT DOCUMENTS

| | | |
|---|---|---|
| DE | 102010036006 A1 | 3/2012 |
| EP | 1704642 B1 | 8/2008 |
| EP | 2228905 A1 | 9/2010 |
| JP | 2010212145 A | 9/2010 |
| WO | 2004040606 A2 | 5/2004 |
| WO | 2010115014 A1 | 10/2010 |
| WO | 2011130755 A2 | 10/2011 |

\* cited by examiner

ACTUATING ELEMENT AND ELECTRONIC DOMESTIC APPLIANCE HAVING AT LEAST ONE ACTUATING ELEMENT

CROSS-REFERENCE TO RELATED APPLICATION

This is a continuation, under 35 U.S.C. § 120, of copending International Application PCT/EP2014/001258, filed May 10, 2014, which designated the United States; this application also claims the priority, under 35 U.S.C. § 119, of German Patent Application DE 10 2013 008 567.5, filed May 17, 2013; the prior applications are herewith incorporated by reference in their entirety.

BACKGROUND OF THE INVENTION

Field of the Invention

The present invention relates to an actuating element, in particular a rotary actuating element, especially an actuating element having a capacitive sensor, and in particular an actuating element for electronic domestic appliances.

In many electronic domestic appliances, such as ovens, hobs or ranges, microwaves, dishwashers, washing machines, tumble dryers and the like, actuating elements in the form of rotary knobs or rotary toggles, slider controllers and the like are often used, with which a user can select specific appliance settings. Conventional rotary toggles having a mechanical operating principle have an operating element mounted rotatably on a switch shaft and the switch shaft is guided through a through-borehole in the operator control panel.

Besides actuating elements having a mechanical operating principle, actuating elements that operate in accordance with a capacitive, inductive, optical, thermal and/or piezoelectric operating principle are also known in that context. In the case of a capacitive actuating element, a measuring electrode formed from an electrically conductive material forms a capacitor together with, for example, a finger of a user through a cover acting as a dielectric and being formed from an electrically insulating material, the capacitor being variable in accordance with the actuation of the actuating element. A change to the capacitance value at the measuring electrode accordingly influences an output signal of the associated sensor circuit, which may be processed by an evaluation/control electronics unit and may be evaluated in order to detect an actuation of the capacitive actuating element where applicable.

German Patent DE 10 2004 013 947 B3 discloses an operating device for a glass ceramic hob or range in the form of a rotary toggle, with which an annular measuring strip with varying physical properties is provided on the underside of the rotary toggle and the glass ceramic hob or range has at least one preferably optical or capacitive sensor for detecting the physical properties opposite the hob or range on the side of the rotary toggle.

International Publication WO 2010/115014 A1, corresponding to U.S. Patent Application Publication US 2010/0253653, discloses a "virtual" rotary knob, which is disposed in a manner fixed against rotation on the user side of an operator control panel and guides the movement of a finger of a user along a circular path. That movement of a finger of a user is detected by capacitive sensor electrodes, which are disposed circularly on a circuit board on the side of the operator control panel facing away from the user.

An operating configuration having a capacitive sensor element for an electrical domestic appliance is known from European Patent EP 1 704 642 B1, corresponding to U.S. Pat. No. 7,667,947, in which the operation is performed by pressing on a shape-changing or resilient operator control panel, which is electrically conductive at least on one outer side and has a capacitive sensor element therebeneath, and by detecting a capacitance change between sensor element and operator control panel caused by a change in the distance therebetween.

SUMMARY OF THE INVENTION

It is accordingly an object of the invention to provide an improved actuating element and an electronic domestic appliance having at least one actuating element, which overcome the hereinafore-mentioned disadvantages of the heretofore-known elements and appliances of this general type and in which the actuating element has a capacitive operating principle.

With the foregoing and other objects in view there is provided, in accordance with the invention, an actuating element, in particular for an electronic domestic appliance, comprising an electrically non-conductive carrier, which defines at least one detection portion, a plurality of electrically conductive measuring electrodes, which are disposed spaced apart from one another along the detection portion of the carrier, and an operating element, which is disposed at a first predefined distance from the measuring electrodes (or a configuration of the measuring electrodes) and is movable relative thereto. In addition, the operating element has at least one sensor portion, which is at least partially electrically conductive and is disposed at a second predefined distance from the measuring electrodes (or the configuration of the measuring electrodes), the second predefined distance being different from the first predefined distance.

The actuating element according to the invention functions in accordance with the capacitive operating principle, wherein the measuring electrodes on one hand and the sensor portion of the operating element on the other hand together with a dielectric (formed by the spacing) therebetween form the electrodes of a capacitor. As the operating element moves relative to the configuration of measuring electrodes, the sensor portion is also moved relative thereto. A number of measuring electrodes or preferably all measuring electrodes can determine a direction of movement and/or a path of travel of the operating element on the basis of a change over time of the capacitance values, caused by a change in the distance between the electrodes at the sensor portion.

Due to the capacitive operating principle, the actuating element according to the invention functions with little wear, since the sensor components which move relative to one another do not contact one another. In addition, it is possible with the embodiment of the actuating element according to the invention to form the movable operating element electrically conductively or at least electrically conductively (for example metallically) on its outer side facing toward the user. In this way, greater structural freedoms and/or improved haptics of the operating element for the user can be attained.

In this context any sort of structural configuration suitable for holding the measuring electrodes in predetermined positions is to be understood as a carrier. The carrier is preferably formed as a housing, a frame, or a substantially solid body. The carrier is manufactured from an electrically non-conductive material, preferably a plastics material. The carrier is preferably manufactured as a one-part or multi-part injection molded part. The carrier defines one or more detection portions for detecting a movement of the operating element relative to the carrier. The carrier is preferably also constructed to guide the operating element relative to the carrier along a predetermined movement path.

The actuating element has a plurality of electrically conductive measuring electrodes. Two, three, four, six, eight, twelve or sixteen measuring electrodes are preferably provided, without the invention being limited to these specific numbers. The greater the number of measuring electrodes provided, the higher is the attainable accuracy when detecting a movement of the operating element relative to the configuration of measuring electrodes. The plurality of measuring electrodes is distanced from one another, in such a way that they are electrically insulated from one another. In this case, an air gap and/or a partition wall portion of the carrier is/are preferably disposed between the individual measuring electrodes. The plurality of measuring electrodes are preferably formed substantially identically to one another and are spaced substantially uniformly from one another, however different types, forms, sizes and/or distances of measuring electrodes in an actuating element may also be used.

In this case, the plurality of measuring electrodes is disposed along the detection portion of the carrier. In this context, the configuration along the detection portion is preferably to be understood to mean a configuration in which the (for example geometric) centers of gravity of the measuring electrodes lie on a line running substantially parallel to the plane or surface of the detection portion. This means that the measuring electrodes themselves do not necessarily have to run completely parallel to the detection portion. In addition, the plurality of measuring electrodes are preferably disposed along the entire detection portion, but may also be provided optionally only along a portion thereof. The measuring electrodes are preferably disposed along the detection portion in one row or in two or more rows parallel to one another.

The second predefined distance between the sensor portion of the operating element and the measuring electrodes or the configuration of measuring electrodes is different from the first predefined distance between the operating element and the measuring electrodes or the configuration of measuring electrodes, i.e. is greater or smaller than this first distance. The greater the difference between the first and the second predefined distances, the greater is the attainable measurement or evaluation accuracy of the actuating element. The second predefined distance is preferably substantially identical over the entire sensor portion. In other embodiments according to the invention the second predefined distance changes once or more, in steps or continuously over the sensor portion.

The operating element has at least one sensor portion, i.e. preferably one, two, three or four sensor portions. In the case of a plurality of sensor portions, i.e. two or more, the second predefined distances from the measuring electrodes or the configuration of measuring electrodes may be substantially identical for all sensor portions or may differ between the sensor portions.

The operating element has at least one sensor portion. The sensor portion is preferably formed integrally with the operating element (preferably in the form of a material reinforcement, embossing, or the like) or is fixedly connected thereto (preferably adhesively bonded, soldered, welded).

The shape and size of the at least one sensor portion are preferably substantially identical to the shape and/or the size of the measuring electrodes when these are each preferably substantially identical to one another between the plurality of measuring electrodes. In the case of a plurality of sensor portions, i.e. two or more, these have substantially identical or different shapes and/or sizes.

In accordance with another preferred feature of the invention, the detection portion of the carrier is formed substantially as a lateral surface of a cylinder, and the operating element is substantially annular and is disposed substantially coaxially with the detection portion of the carrier. In this embodiment the actuating element has the form of a rotary knob.

The substantially cylindrical detection portion in this context has a substantially cylindrical shape with a base area and a circumferential lateral surface. In this case, the base area is in principle formed arbitrarily, preferably substantially in a rotationally symmetrical or circular or (preferably regularly) polygonal manner. The lateral surface extends over a height, which optionally may be the same size as, greater than or smaller than the greatest extension (for example diagonal) of the base area. The lateral surface runs starting from the base area preferably substantially in a straight line or curved once or more in a convex or concave manner. In addition, the lateral surface runs starting from the base area preferably substantially perpendicularly, tapering conically, or widening conically. Furthermore, combinations of the structures specified herein of the cylindrical shape of the detection portion are also conceivable. Besides the detection portion, the carrier is preferably also substantially cylindrical on the whole.

The ring shape (or also sleeve, bushing or tube shape) of the operating element corresponds substantially to the embodiment of the cylindrical detection portion. The basic shape of the ring is arbitrary in principle, but is preferably circular or (preferably regularly) polygonal.

With the embodiment of the actuating element as a rotary knob, the operating element preferably can be rotated endlessly or in an unlimited manner about the detection portion of the carrier. In other embodiments the angle of rotation is preferably limited.

In accordance with a further preferred feature of the invention, the operating element is formed substantially from electrically conductive material, preferably from a metal (preferably stainless steel or the like).

In accordance with an added preferred feature of the invention, at least one electrically non-conductive insulation element and/or at least one air gap is/are provided between the measuring electrodes or the configuration of measuring electrodes and the operating element. The insulation element and/or air gap form a dielectric of the capacitor of the sensor configuration. The insulation element is manufactured from an electrically non-conductive material, preferably a plastics material. A layer thickness of the at least one insulation element is preferably selected to be (at least slightly) smaller than the smaller distance of the first and second predefined distances, in such a way that the operating element can be moved relative to the measuring electrodes in an unhindered manner. The at least one insulation element is preferably fixedly connected to the carrier (preferably by adhesive bonding, latching, pressing, etc.). In the case of a substantially cylindrical detection portion, the at least one insulation element (similarly to the operating element) is substantially annular.

In accordance with an additional preferred feature of the invention, the operating element is at least partially resiliently deformable. The operating element is preferably deformable up to a third predefined distance from the measuring electrodes or the configuration of measuring electrodes, which third predefined distance is different from the first predefined distance and from the second predefined distance.

In this embodiment of the actuating element an actuation as a pushbutton is also possible besides an actuation as a rotary knob, and therefore the operating or input possibilities can be expanded. In particular, it is preferably possible to locally deform the operating element by pressure (for example by a finger of a user) and to thus reduce the distance between the operating element and the measuring electrodes at this point. In addition, an associated operator control panel can be constructed more simply, since fewer actuating elements have to be integrated.

The third predefined distance is preferably smaller than the first predefined distance and greater than the second predefined distance.

In accordance with yet another preferred feature of the invention, the operating element is deformable only in regions that are different from those having a sensor portion, i.e. in which no sensor portion is provided. These deformable regions of the operating element are preferably marked for the user (for example optically and/or haptically).

In accordance with yet a further feature of the invention, at least one compressible, electrically non-conductive insulation element and/or an air gap is/are preferably provided between the measuring electrodes or the configuration of measuring electrodes and the operating element. The insulation element and/or air gap form a dielectric of the capacitor of the sensor configuration. The insulation element is manufactured from an electrically non-conductive material, preferably a plastics material or a foam material. A layer thickness of the at least one insulation element is preferably selected to be (at least slightly) smaller in the non-compressed state than the smaller distance of the first and second predefined distances, in such a way that the operating element can be moved relative to the measuring electrodes in an unhindered manner.

In accordance with yet an added preferred feature of the invention, the measuring electrodes are connected to a control device, which is disposed in/on the actuating element, particularly preferably within the carrier. In other embodiments of the invention, the control device may also be provided separately from the actuating element. The control device is preferably constructed to evaluate the measuring signals at the plurality of measuring electrodes. The control device is preferably constructed to detect the capacitance values belonging to the individual measuring electrodes and changes thereof substantially parallel to one another or sequentially. The control device is preferably constructed to detect a movement measure and/or a movement direction on the basis of the capacitance values or capacitance value changes belonging to the sensor elements, and in the case of a rotary knob to detect an angle of rotation and/or a direction of rotation of a relative movement of the operating element.

In accordance with yet an additional preferred feature of the invention, the actuating element has a (end-face) cover facing toward the user, which cover is at least partially permeable to light, and also at least one indicating element.

In this embodiment the actuating element of the invention additionally has at least one indicating element. This facilitates the operation of the actuating element for the user, since information (for example adjustment possibilities, current set values, operating state, etc.) can be communicated to the user through the least one indicating element. In addition an operating unit with this embodiment of the actuating element may be formed in a more compact and space-saving manner, since it is possible to dispense with additional indicating elements besides the actuating element. In addition, an operator control panel where applicable may be constructed more simply, since fewer elements have to be integrated.

In this context an indicating element is to be understood to mean any type of configuration that is suitable for optically presenting information to the user. Suitable indicating elements, in particular, include simple lighting elements (for example light-emitting diodes or light-emitting diode groups), optical waveguides coupled with lighting elements, displays (for example LED, LCD, etc.) and the like. The at least one indicating element preferably has one, two, three or four indicating elements or a unit formed from two or more indicating elements.

The cover is preferably manufactured from an electrically non-conductive material, preferably a plastics material. The cover is preferably manufactured as a one-part or multi-part injection molded part. The cover is preferably connected detachably or permanently to the carrier of the fastening element. The connection between cover and carrier is preferably established by using latching, clipping, adhesive bonding, press fitting, screwing or the like.

With the objects of the invention in view, there is concomitantly provided an electronic domestic appliance, such as an oven, a hob or range, a microwave, a dishwasher, a washing machine, a tumble dryer and the like. The electronic domestic appliance comprises an operator control panel and at least one actuating element according to the invention being preferably mounted on the operator control panel or inserted through such an operator control panel.

Other features which are considered as characteristic for the invention are set forth in the appended claims.

Although the invention is illustrated and described herein as embodied in an actuating element and an electronic domestic appliance having at least one actuating element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The above features and advantages as well as further features and advantages of the invention will be better understood from the following description of a preferred non-limiting exemplary embodiment on the basis of the accompanying partly diagrammatic drawings.

The actuating element according to the invention can be used advantageously in electronic domestic appliances for adjusting and selecting different operating parameters (for example a washing program, a rinsing program, a spin speed, a temperature, a cooking time, a cooking setting, etc.).

Figure 1:
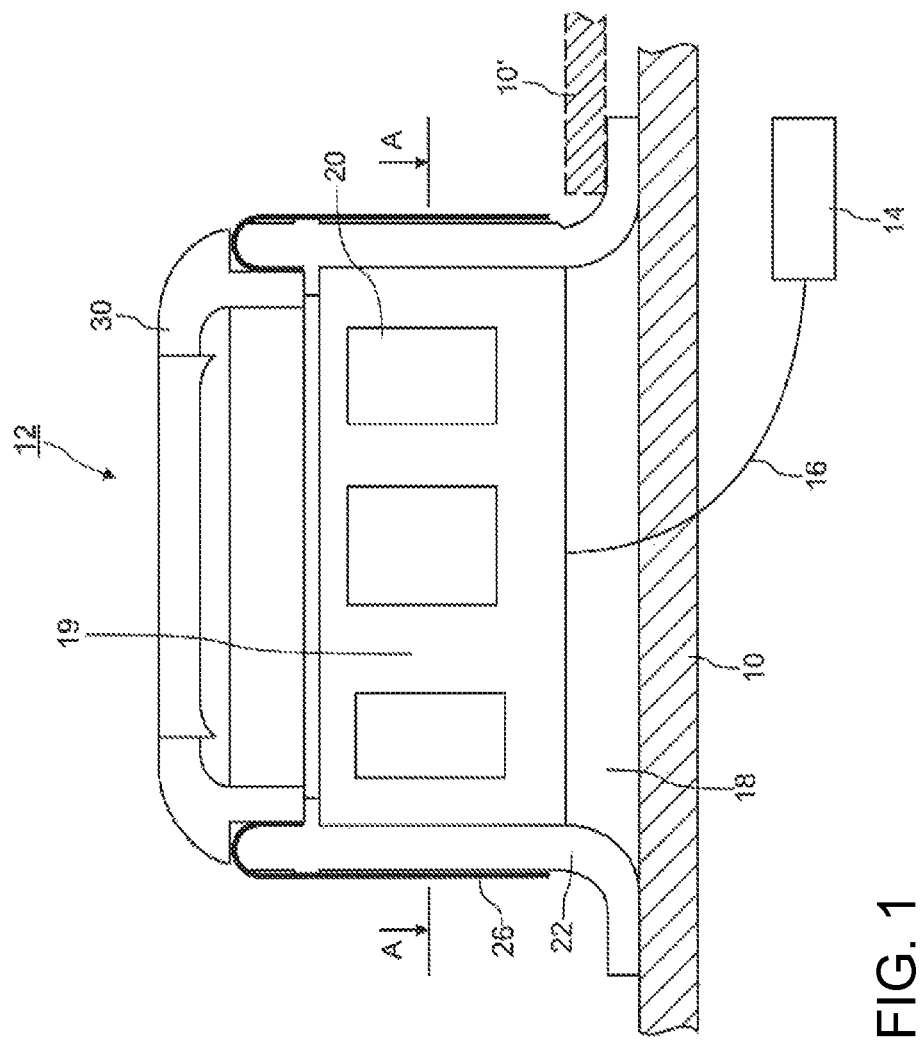
FIG. 1 is a fragmentary, diagrammatic, partly-sectional side-elevational view of an actuating element in accordance with an exemplary embodiment of the present invention.

Referring now to the figures of the drawings in detail and first, particularly, to FIG. 1 thereof, there is seen an actuating element 12 which is attached, for example, to an operator control panel 10, 10' of a domestic appliance, in which the operator control panel is manufactured from plastic or metal. In a variant, the actuating element 12 is placed on the outer side (at the top in FIG. 1) of the operator control panel 10 facing toward a user, in which case electrical connections are guided through a corresponding aperture in the operator control panel 10 or a wireless connection is provided. In another variant the actuating element 12 is slid through an aperture in the operator control panel 10' from behind (at the bottom in FIG. 1), in such a way that the actuating element protrudes from the operator control panel 10' in the direction of the user. In any case the actuating element 12 is mounted fixedly on the operator control panel 10, 10' (for example by adhesive bonding, latching, pressing, screwing, etc.), but is preferably detachable for repair purposes.

As is indicated in FIG. 1 the actuating element 12 is connected to a control device 14 through at least one (wired or wireless) connection line 16. This control device 14, depending on the embodiment of the actuating element 12, may be integrated in the actuating element, attached directly thereto, or positioned separately therefrom.

The structure and operating principle of a preferred exemplary embodiment of the actuating element 12 according to the invention will now be explained in greater detail with reference to FIGS. 1 to 3.

The actuating element 12 formed in this exemplary embodiment as a rotary knob has a knob-shaped carrier 18 formed from an electrically non-conductive plastics material with a substantially cylindrical detection portion 19 having a substantially circular base area and a lateral surface proceeding from the base area substantially in a straight line. A plurality of electrically conductive measuring electrodes 20 is disposed on the carrier 18 along this lateral surface of the detection portion 19.

Figure 2:
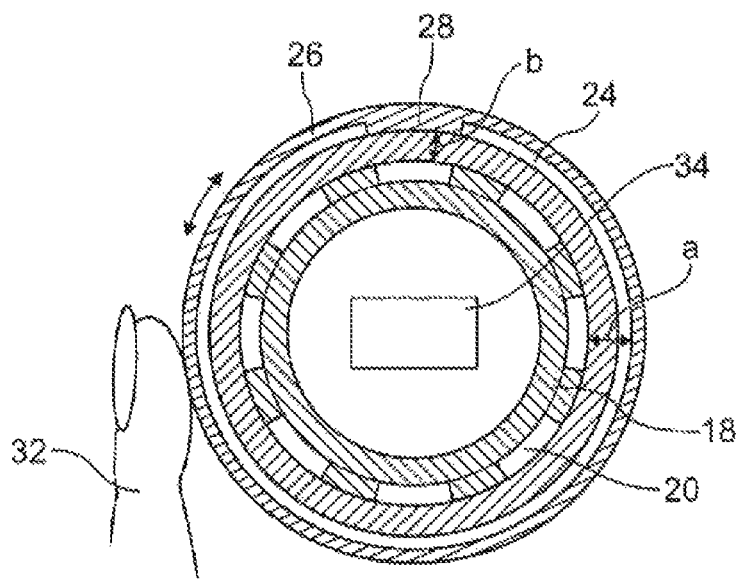
FIG. 2 is a cross-sectional view of the actuating element illustrated in FIG. 1, which is taken along a section line A-A in FIG. 1 in a first state of actuation.

As is indicated in FIG. 2 the measuring electrodes 20 are each accommodated in recesses or pockets in the carrier 18 and are thus spaced apart from one another and electrically insulated from one another by partition walls of the carrier. In this exemplary embodiment a total of eight measuring electrodes 20 are disposed around the entire circumference of the lateral surface, i.e. along the entire detection portion 19 and in a row over a circle. In this exemplary embodiment the measuring electrodes each have a rectangular basic shape and are curved parallel to the lateral surface of the cylindrical detection portion.

The measuring electrodes 20 are each connected to the control device 14, in such a way that the capacitance values or the capacitance value changes at all measuring electrodes can be detected and evaluated synchronously or sequentially over time.

The detection portion 19 of the carrier 18 is surrounded by an annular, electrically non-conductive insulation element 22 formed from a plastics material. The insulation element 22 is fixedly connected to the carrier 18, for example it is plugged thereon and adhesively bonded thereto in a foot region.

The insulation element 22 is surrounded completely circumferentially in the region of the detection portion 19 of the carrier 18 by an operating element 26, which likewise is substantially annular. The operating element 26 is manufactured from an electrically conductive material, such as metal, preferably stainless steel. As can be seen, in particular, in FIGS. 2 and 3, the operating element 26 is additionally distanced radially from the insulation element 22 through an air gap 24.

As is illustrated by way of example in FIG. 1, the operating element 26 is additionally shaped in such a way that it can be suspended on the insulation element 22. In this case, the operating element 26 is guided only through the insulation element 22, in such a way that it can be rotated relative thereto and therefore also relative to the carrier 18, in particular also relative to the configuration of measuring electrodes 20 around the carrier 18. The operating element 26 is disposed in this case substantially coaxially with the detection portion 19 of the carrier 18.

In this case, depending on the embodiment of the actuating element, the operating element 26 can be rotated endlessly around the carrier 18 or may be limited in terms of its angle of rotation by one or more stops.

Furthermore, the operating element 26 is provided with a sensor portion 28. In this exemplary embodiment this sensor portion 28 is formed by a material reinforcement or an embossing of the metal ring 26, as is illustrated in FIGS. 2 and 3.

If a user contacts the metal ring 26, for example with their finger 32, this metal ring thus forms a capacitor together with each of the measuring electrodes 20, in which case the insulation element 22 and the air gap 24 form a dielectric. The capacitance values may be tapped at the measuring electrodes 20 and evaluated by the control device 14.

As is illustrated in FIG. 2 the operating element 26 is spaced apart from the configuration of the measuring electrodes 20 in the radial direction by a first predefined distance a. The sensor portion 28 of the operating element 26 is by contrast spaced apart from the configuration of the measuring electrodes 20 in the radial direction m by a second predefined distance b, which is different from the first predefined distance (a≠b). In the present exemplary embodiment the second predefined distance b is smaller than the first predefined distance a (b<a).

If the operating element 26 is now rotated about the carrier 18 by a user using one or more fingers 32, the sensor portion 28 on the operating element 26 thus also moves relative to the measuring electrodes 20. The capacitance values of the capacitors at the measuring electrodes 20 thus change, since the distance between the electrodes 20, 28 and the thickness of the dielectric 22, 24 therebetween change.

Due to a synchronous or sequential querying of the measured values at the measuring electrodes 20, the control device 14 may therefore determine an angle of rotation and/or a direction of rotation of the operating element 26 about the carrier 18. With the aid of such a rotary movement, a user for example may select a program (for example a washing program such as a boil wash, color wash, gentle program, etc.) and/or a desired parameter (for example temperature, spin speed, cooking time, etc.).

In order to confirm a selection made in this way it is possible to provide an additional (mechanical or touchsensitive) push switch. In a preferred exemplary embodiment of the invention, however, this function is integrated in the actuating element 12.

Figure 3:
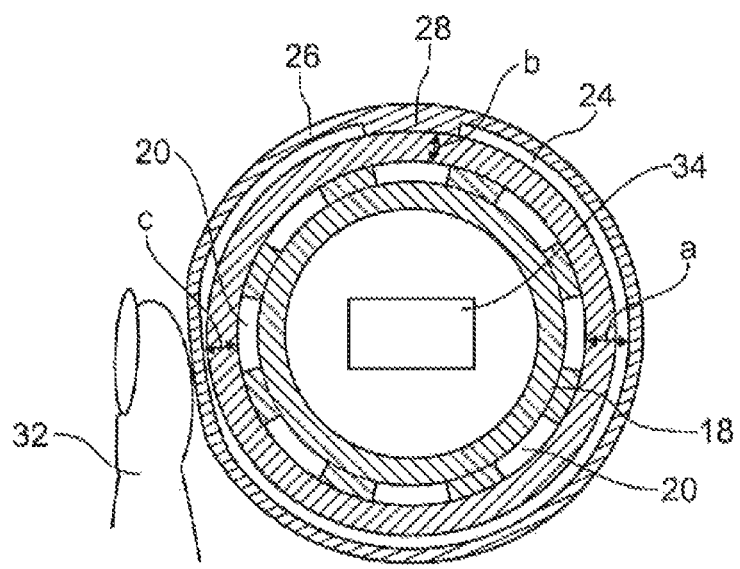
FIG. 3 is a cross-sectional view of the actuating element illustrated in FIG. 1, which is taken along the section line A-A in FIG. 1 in a second state of actuation.

As is indicated in FIG. 3 the annular operating element 26 is resiliently deformable in the regions outside the sensor portion 28. In this case the insulation element 22 may also be resiliently deformable, in particular compressible, between the operating element 26 and the measuring electrodes 20.

The distance between the operating element 26 and the configuration of measuring electrodes 20 is changed up to a third predefined distance c by exerting a pressure on the operating element 26, for example by using a finger 32 of the user. This third predefined distance c differs both from the first predefined distance a and the second predefined distance b (a≠b≠c). The clearer these predefined distances a, b, c differ from one another, the greater is the attainable accuracy and reliability when detecting an actuation of the actuating element. The third predefined distance c may be selected optionally to be greater or smaller than the second predefined distance b (c>b or c<b) depending on whether or not the insulation element 22 is compressible.

A change in distance between the operating element 26 and the measuring electrodes 20 to the third predefined distance c causes a corresponding change in the capacitance value at the respective measuring electrode 20. This change in capacitance may be detected by the control device 14 and classified as a pressure actuation of the operating element 26 by the user, for example to confirm their selection made previously by way of a rotary movement of the operating element 26.

In order to simplify the operation, the deformable portions or regions of the operating element 26 are marked for the user, for example optically and/or haptically.

Furthermore, a cover 30 is placed on the carrier 18 on the end face of the actuating element 12 (at the top in FIG. 1) facing toward the user. This cover 30 is, for example, an injection molded part formed from a plastics material. In addition, the cover 30 is fixedly connected to the carrier 18 (for example by pressing, latching, adhesive bonding, etc.).

In a preferred embodiment of the actuating element 12, the cover 30 is at least partially transparent or permeable to light. At least one indicating element 34 is disposed within the carrier 18, as indicated in FIGS. 2 and 3. Information, for example concerning the current parameter settings and the operating state of the appliance, can be displayed to the user by using the indicating element 34.

The indicating element 34 for example is a display. This display 34 is preferably controlled by the control device 14. Besides this display 34, further indicating elements may be provided, for example in the form of light-emitting diode (groups) or optical waveguides coupled to light-emitting diode (groups).

The invention claimed is:

1. An actuating element, comprising:
   an electrically non-conductive carrier defining at least one detection portion;
   a plurality of electrically conductive measuring electrodes spaced apart from one another along said detection portion of said carrier; and
   an operating element disposed at a first predefined distance from said measuring electrodes and being movable relative to said measuring electrodes;
   said operating element having at least one sensor portion being at least partially electrically conductive and disposed at a second predefined distance from said measuring electrodes, said second predefined distance being different from said first predefined distance.

2. The actuating element according to claim 1, wherein the actuating element is an electronic domestic appliance actuating element.

3. The actuating element according to claim 1, wherein:
   said detection portion of said carrier is formed substantially as a lateral surface of a cylinder; and
   said operating element is substantially annular and is disposed substantially coaxially with said detection portion of said carrier.

4. The actuating element according to claim 1, wherein said operating element is formed of an electrically conductive material.

5. The actuating element according to claim 1, which further comprises at least one of at least one electrically non-conductive insulation element or an air gap provided between said measuring electrodes and said operating element.

6. The actuating element according to claim 1, wherein said operating element is at least partially resiliently deformable.

7. The actuating element according to claim 6, wherein said operating element is deformable up to a third predefined distance from said measuring electrodes, and said third predefined distance is different from said first predefined distance and from said second predefined distance.

8. The actuating element according to claim 6, wherein said operating element is deformable only in regions in which no sensor portion is provided on said operating element.

9. The actuating element according to claim 6, which further comprises at least one of at least one compressible, electrically non-conductive insulation element or an air gap provided between said measuring electrodes and said operating element.

10. The actuating element according to claim 1, which further comprises a control device disposed in or on the actuating element, said measuring electrodes being connected to said control device.

11. The actuating element according to claim 1, which further comprises an actuating element cover facing toward a user, said cover being at least partially permeable to light and having at least one indicating element.

12. An electronic domestic appliance, comprising:
    an operator control panel; and
    at least one actuating element according to claim 1.

* * * * *